(12) United States Patent
Kim et al.

(10) Patent No.: US 7,294,962 B2
(45) Date of Patent: Nov. 13, 2007

(54) ORGANIC ELECTROLUMINESCENT DISPLAY DEVICE AND METHOD FOR MANUFACTURING THE SAME

(75) Inventors: Mu-Hyun Kim, Suwon-si (KR); Kyong-Do Kim, Seoul (KR)

(73) Assignee: Samsung SDI Co., Ltd., Suwon (KR)

( * ) Notice: Subject to any disclaimer, the term of this patent is extended or adjusted under 35 U.S.C. 154(b) by 204 days.

(21) Appl. No.: 10/937,294

(22) Filed: Sep. 10, 2004

(65) Prior Publication Data

US 2005/0116623 A1    Jun. 2, 2005

(30) Foreign Application Priority Data

Nov. 29, 2003   (KR) ...................... 10-2003-0086154

(51) Int. Cl.
*H05B 33/00*    (2006.01)
(52) U.S. Cl. ........................................ 313/504; 445/23
(58) Field of Classification Search ......... 313/501–506
See application file for complete search history.

(56) References Cited

U.S. PATENT DOCUMENTS

| 6,727,871 B1 | 4/2004 | Suzuki et al. |
| 2003/0203527 A1 | 10/2003 | Bae et al. |

FOREIGN PATENT DOCUMENTS

| EP | 0907304 | 4/1999 |
| EP | 1333497 | 8/2003 |
| JP | 03-105893 | 5/1991 |
| JP | 10-255975 | 9/1998 |
| JP | 2001-110575 | 2/2001 |
| JP | 2003-022035 | 1/2003 |
| JP | 2003-076332 | 3/2003 |
| JP | 2003-332082 | 11/2003 |
| JP | 2004-355918 | 12/2004 |

OTHER PUBLICATIONS

European Search Report dated Feb. 23, 2005.

*Primary Examiner*—Joseph Williams
(74) *Attorney, Agent, or Firm*—H.C. Park & Associates, PLC (57) ABSTRACT

The invention is directed to an improved organic electroluminescent device. In one embodiment, the OLED includes a thin film transistor formed in a non-emission region on an insulating substrate that also includes source and drain electrodes. The OLED further includes a lower electrode formed in an emission region on the insulating substrate and connected to one electrode of the source/drain electrodes through a contact hole. The OLED yet further includes an organic emission layer formed in the emission region on the lower electrode, and an upper electrode formed on the organic emission layer, wherein the lower electrode has a surface with its corners rounded off. The lower electrode acts as a pixel electrode. Having its surface with corners rounded off prevents short-induced defects caused by outgassing.

10 Claims, 14 Drawing Sheets

ORGANIC ELECTROLUMINESCENT DISPLAY DEVICE AND METHOD FOR MANUFACTURING THE SAME

CROSS-REFERENCE TO RELATED APPLICATION

This application claims priority of Korean Patent Application No. 2003-86154, filed Nov. 29, 2003, which is hereby incorporated by reference.

BACKGROUND OF THE INVENTION

1. Field of the Invention

The present invention relates to an organic electroluminescent display device and method for manufacturing the same. More particularly, the invention is directed to an organic electroluminescent display device and method for fabricating the same, in which corners of a lower (pixel) electrode are rounded off, thereby preventing contamination caused by outgassing and short-induced defects.

2. Description of the Related Art

With the development of active matrix organic light emitting devices (AMOLED) into flat panel display devices using organic electroluminescence devices (OELDs) and with application of AMOLEDs to mobile phones, great reduction in thickness, size and fabricating cost have been achieved.

Figure 1A:
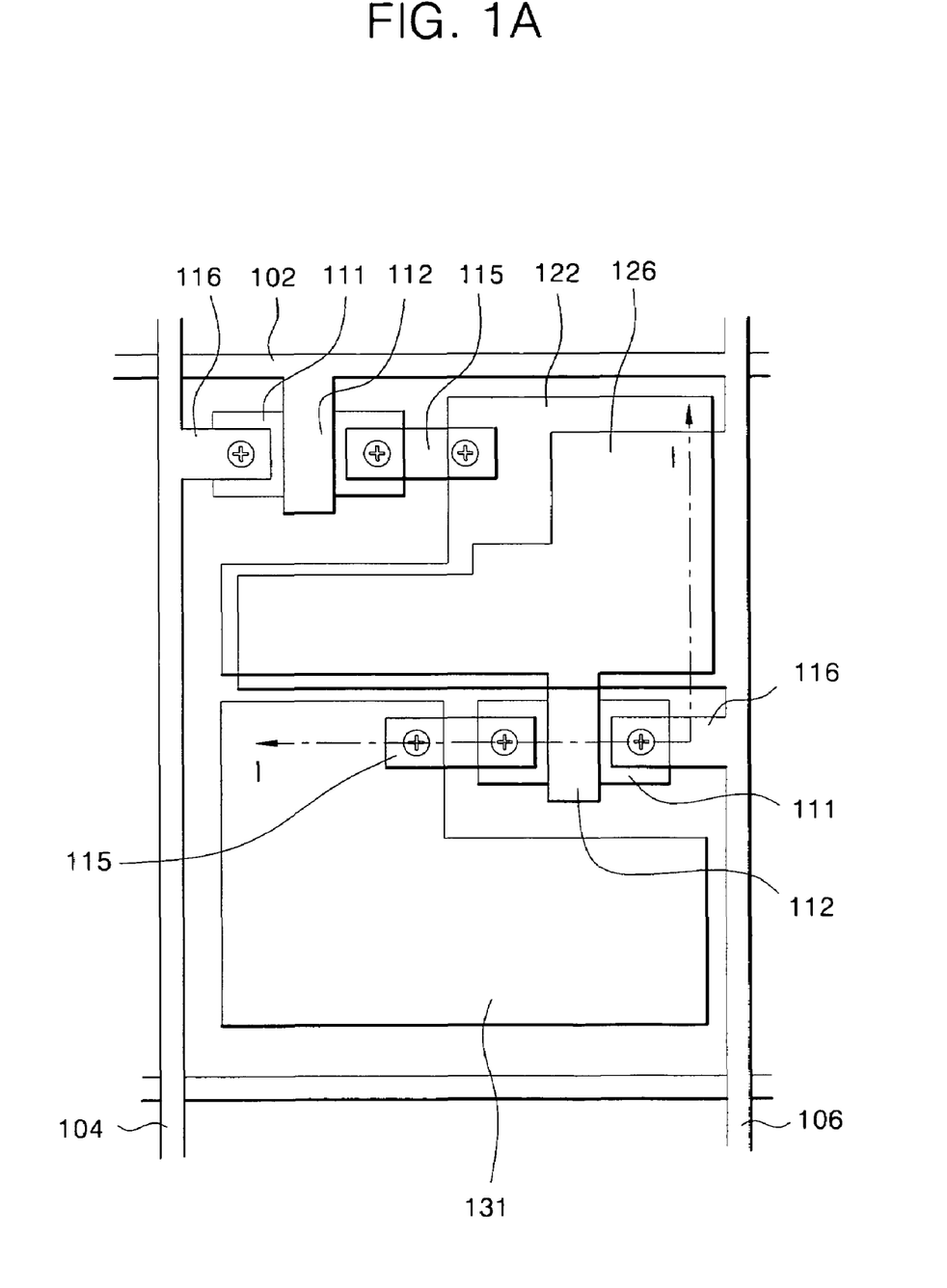
FIG. 1A shows a planar structure of a conventional AMOLED.
Figure 1B:
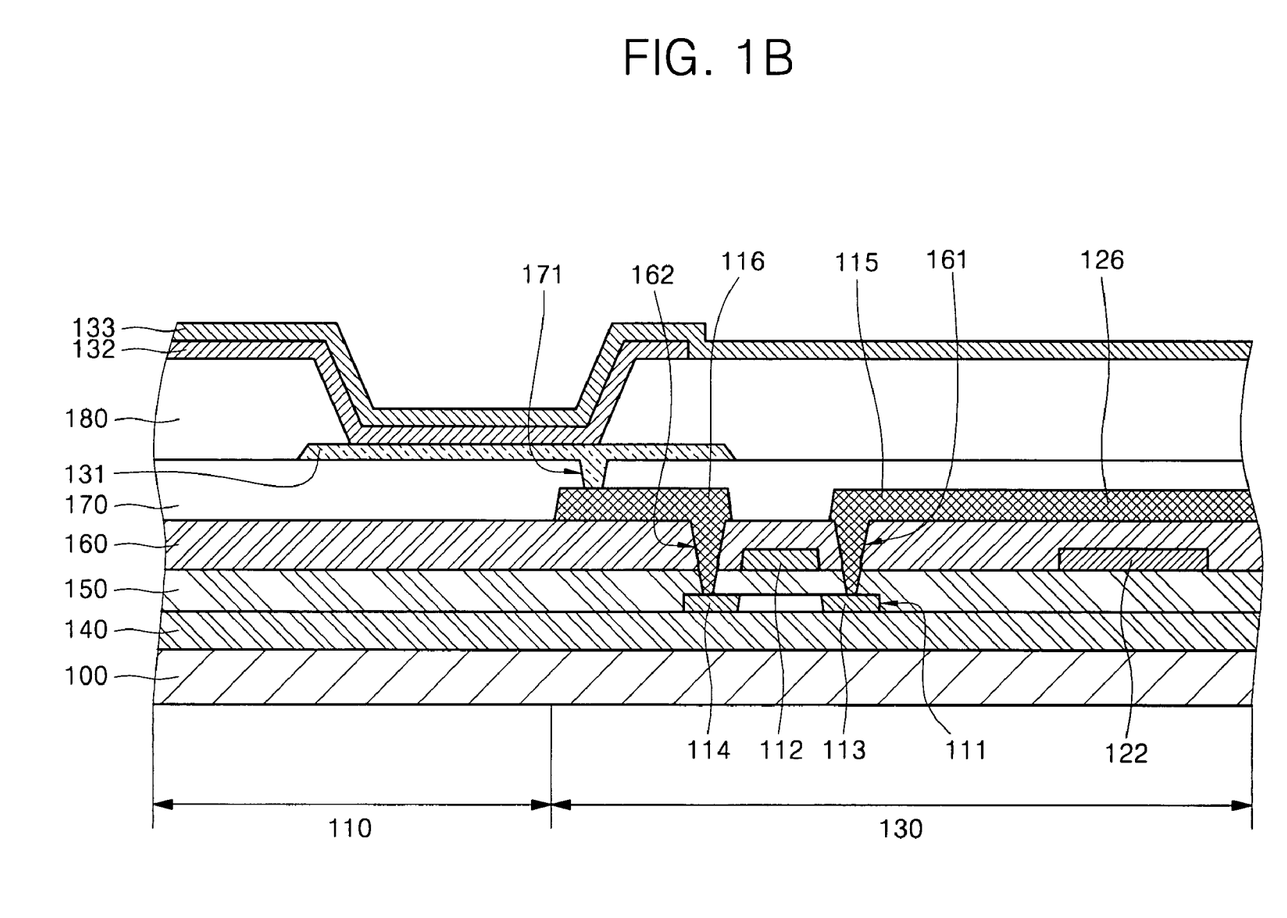
FIG. 1B is a cross-sectional view taken along the line I-I of FIG. 1A.

FIG. 1A shows a planar structure of a conventional AMOLED having two transistors and a capacitor. FIG. 1B is a cross-sectional view taken along the line I-I of FIG. 1A.

Referring to FIG. 1B, the conventional AMOLED includes an emission region 110 and a non emission region 130. In the emission region 110, a lower electrode 131 (e.g., a pixel electrode), an organic emission layer 132 and an upper electrode 133 are formed. In the non-emission region 130 two thin film transistors (TFTS) and a capacitor are formed.

A buffer layer 140 is formed on a transparent insulating substrate 100 such as a glass substrate, and an amorphous silicon layer is deposited on the buffer layer to form a semiconductor layer 111. The semiconductor layer 111 is formed by performing a crystallization process after patterning the deposited amorphous silicon layer. Then, a gate insulating layer 150 is formed on the entire surface of the substrate. Thereafter, a metallic material for a gate electrode is deposited and patterned on the gate insulating layer 150 to form a gate 112 on the semiconductor layer 111. Additionally, a capacitor lower electrode 122 is simultaneously formed at this time. Upon formation of the gate 112 and the capacitor lower electrode 122, a gate line 102 of FIG. 1A is also formed.

Thereafter, source/drain regions 113 and 114 are formed by ion implantation of, for example, P or N type impurities, into the semiconductor layer 111.

Next, an interlayer insulating layer 160 is formed on the entire surface of the substrate. Then the interlayer insulating layer 160 and the gate insulating layer 150 are etched to expose portions of the source/drain regions 113 and 114, thereby forming contact holes 161 and 162 for source/drain electrodes.

Then, after a metallic material for the source/drain electrodes is deposited on the interlayer insulating layer 160, the source/drain electrodes 115 and 116 are formed to contact with the source/drain regions 113 and 114 through the contact holes 161 and 162. Then a capacitor upper electrode 126 is formed which extends from any one electrode, for example, the source electrode 115, of the source/drain electrodes 115 and 116; at the same time, a data line 104 and a power line 106 of FIG. 1A are also formed.

Thereafter, a passivation layer 170 is formed on the interlayer insulating layer 160. The passivation layer 170 is etched as to expose a portion of the other electrode, for example, the drain electrode 116, of the source/drain electrodes 115 and 116, thus forming a contact hole 171 for a pixel electrode.

Then, a transparent conductive layer is deposited on the passivation layer 170 and is patterned to form the lower electrode 131 contacting with the drain electrode 116 through the contact hole 171 for pixel electrode in the emission region 130.

After an insulating layer 180 is formed on the passivation layer 170, an opening 181 is formed to expose the lower electrode 131. An organic emission layer 132 is formed on a planarization layer 180 including the opening 181, and an upper electrode 133 is formed thereon.

In the conventional OLED, although the insulating layer 180 is similar to a pixel definition layer (PDL) defining the emission region, the PDL is commonly formed of an organic layer. However, a problem arises in that the organic emission layer 132 becomes contaminated due to outgassing. To address this problem, an organic light emitting display device may be formed without such pixel definition layer. However, another problem often experienced in conventional OLEDs formed without pixel definition layers is short-induced defects that generate a dark spot in their corresponding pixels.

Figure 2A:
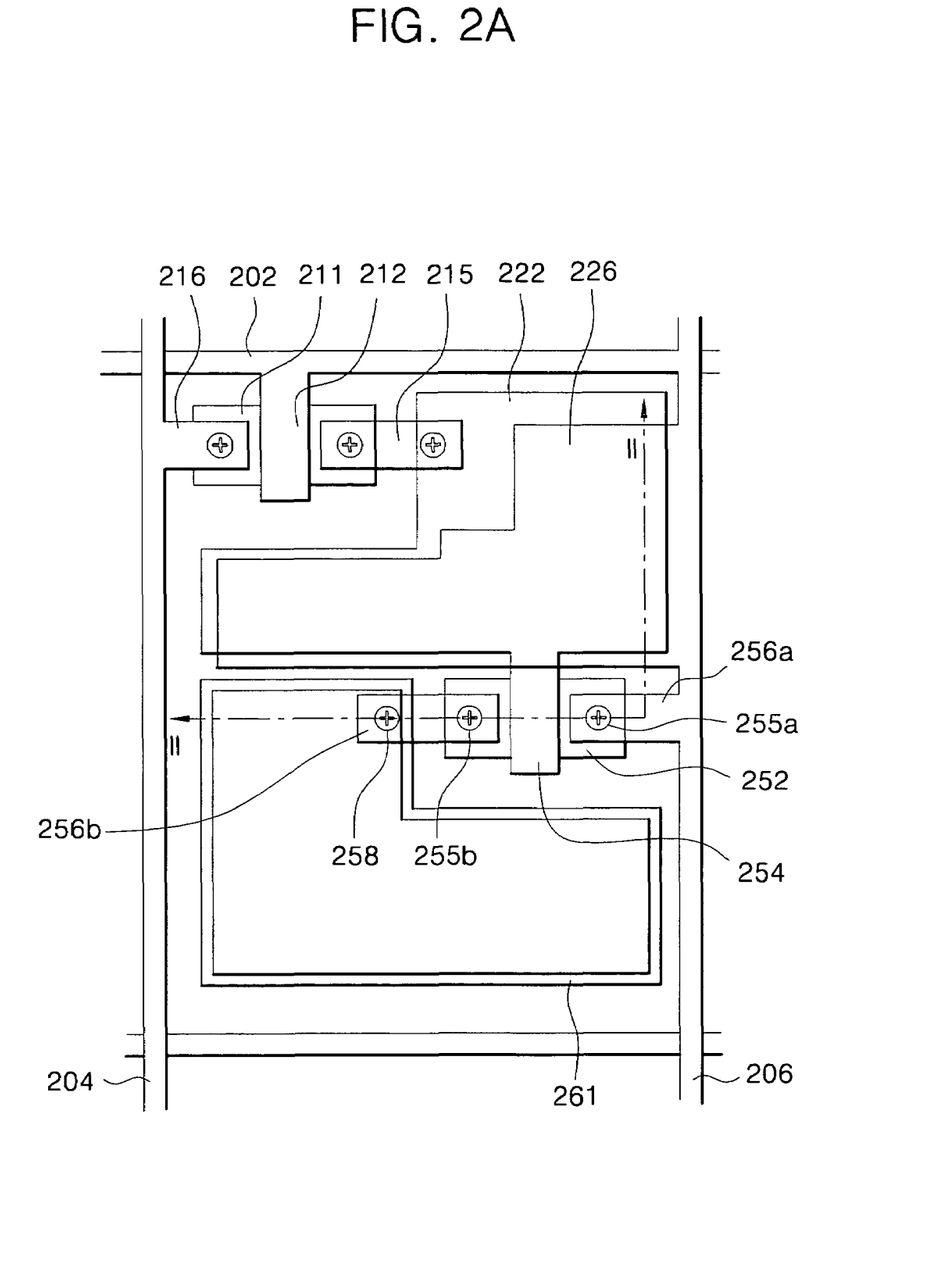
FIG. 2A shows a planar structure of another conventional organic electroluminescent display device.
Figure 2B:
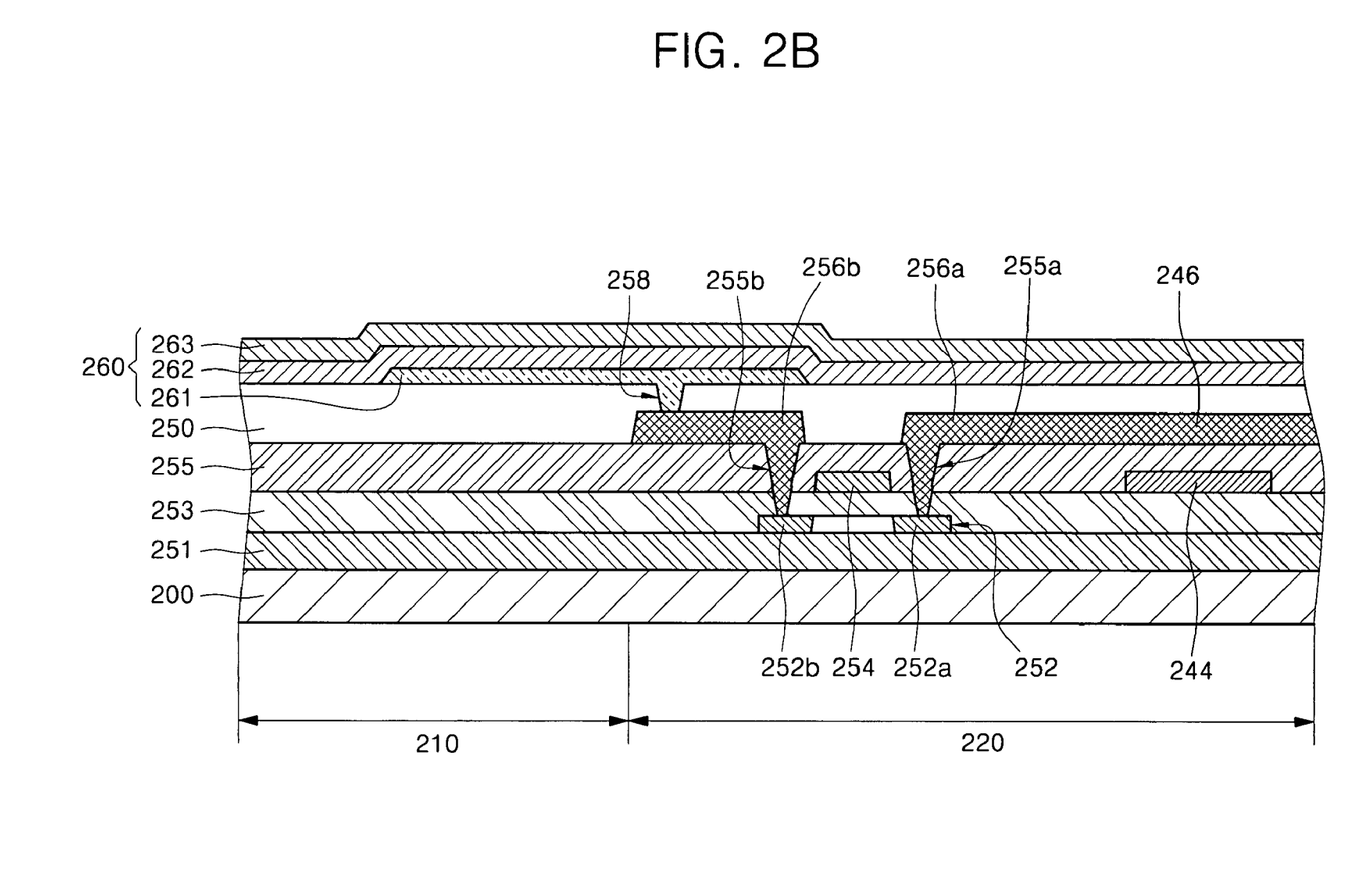
FIG. 2B is a cross-sectional view taken along the line II-II of FIG. 2A.

For example, FIG. 2A shows an embodiment of the planar structure of an organic light emitting display device without a pixel definition layer, and FIG. 2B is a cross-sectional view taken along the line II-II of FIG. 2A.

A method for manufacturing the organic light emitting display device without such pixel definition layer is now explained with reference to FIGS. 2A and 2B.

Referring to FIGS. 2A and 2B, a thin film transistor and a capacitor are formed on a non emission region 220 in the same manner and structure as illustrated in FIGS. 1A and 1B. Then, a lower electrode 261 is formed by depositing a transparent conductive layer in the emission region on the entire surface of a substrate so as to contact source/drain electrodes formed in the non-emission region through a contact hole 255b for pixel electrode and patterning the same.

Figure 2C:
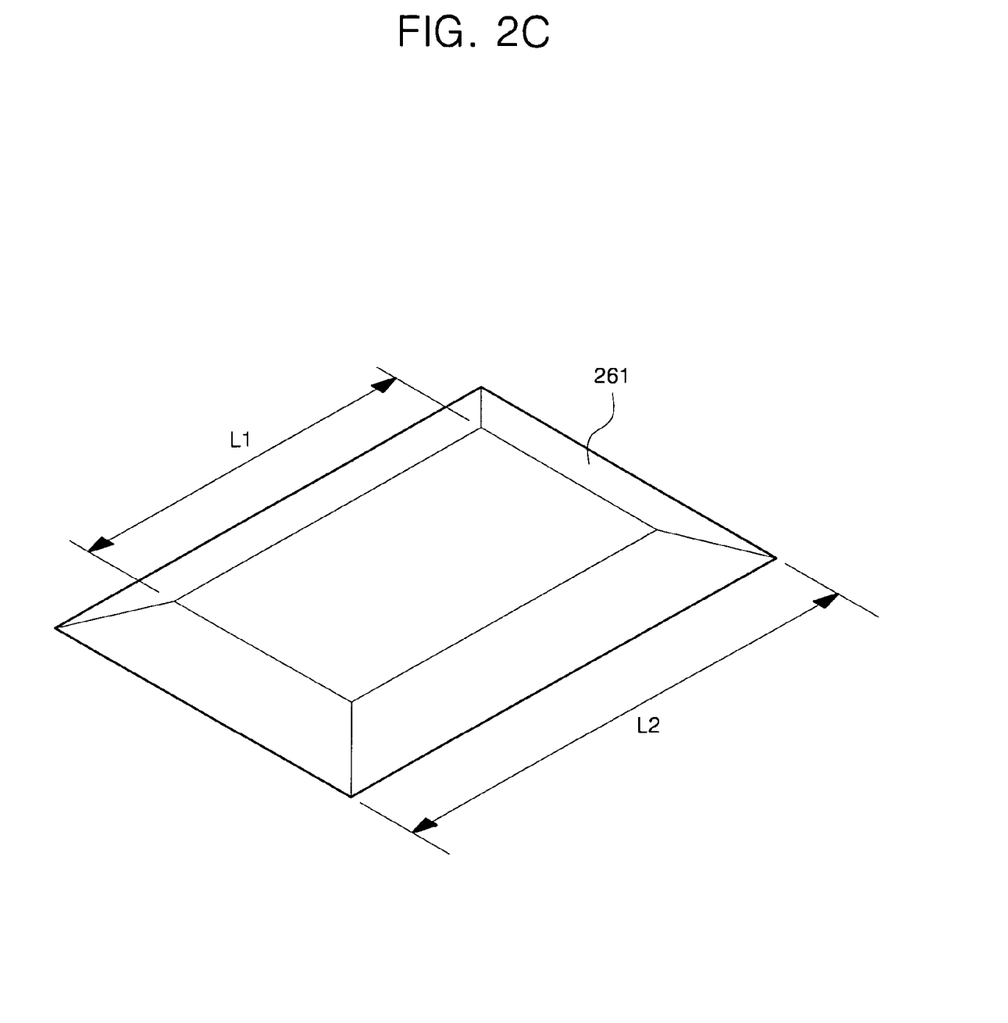
FIG. 2C is a perspective view showing steps for forming the lower electrode of FIG. 2A.
Figure 2D:
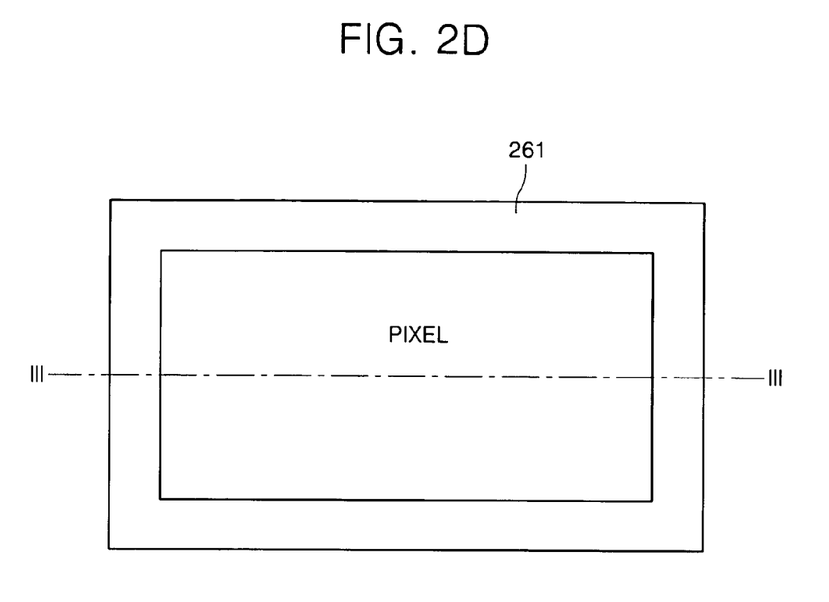
FIG. 2D is a plan view of the lower electrode of FIG. 2C.
Figure 2E:
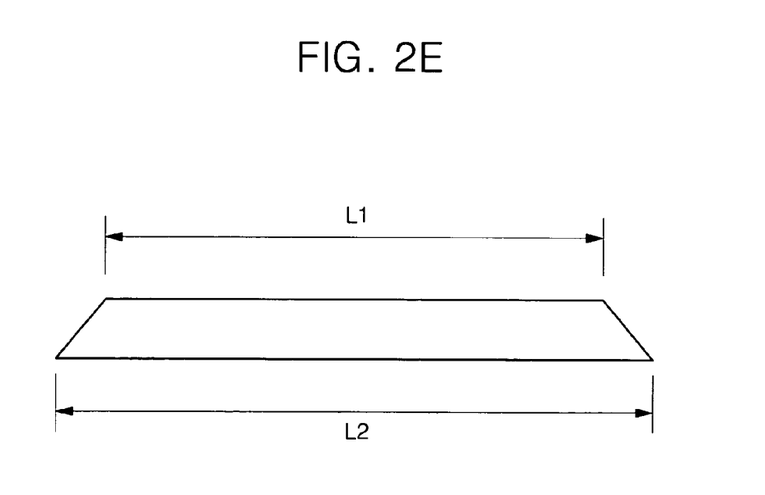
FIG. 2E is a cross-sectional view taken along the line III-III of FIG. 2D.

Now, steps for forming the lower electrode 261 are illustrated through FIGS. 2C to 2E. FIG. 2C is a perspective view showing the steps for forming the lower electrode 261, FIG. 2D is a plan view of the lower electrode 261, and FIG. 2E is a cross-sectional view taken along the line III-III of FIG. 2D.

Referring to FIGS. 2C to 2E, corners of upper and lower portions of the lower electrode 261 are formed in an angle shape. As shown in FIG. 2E, a length L2 of the lower portion of the lower electrode 261 is formed longer than a length L1 of the upper portion of the lower electrode 261. That is, the lower electrode 261 has a side slanted at a tapered angle.

An organic emission layer 262 is formed on the lower electrode 261. Then an upper electrode 263 made a metallic material is formed on the organic emission layer.

Upon the formation of the organic emission layer 262 on the lower electrode 261, a step is formed. However, in use, a short-induced defect may be generated due to an open edge phenomenon. Thus, in the case where the upper and lower portions of the transparent conductive layer are angled, the organic emission layer 262 often deteriorates at its corner portion to expose the lower electrode 261.

To address this problem, embodiments of the invention provide a lower pixel electrode having rounded corners.

Figure 2F:
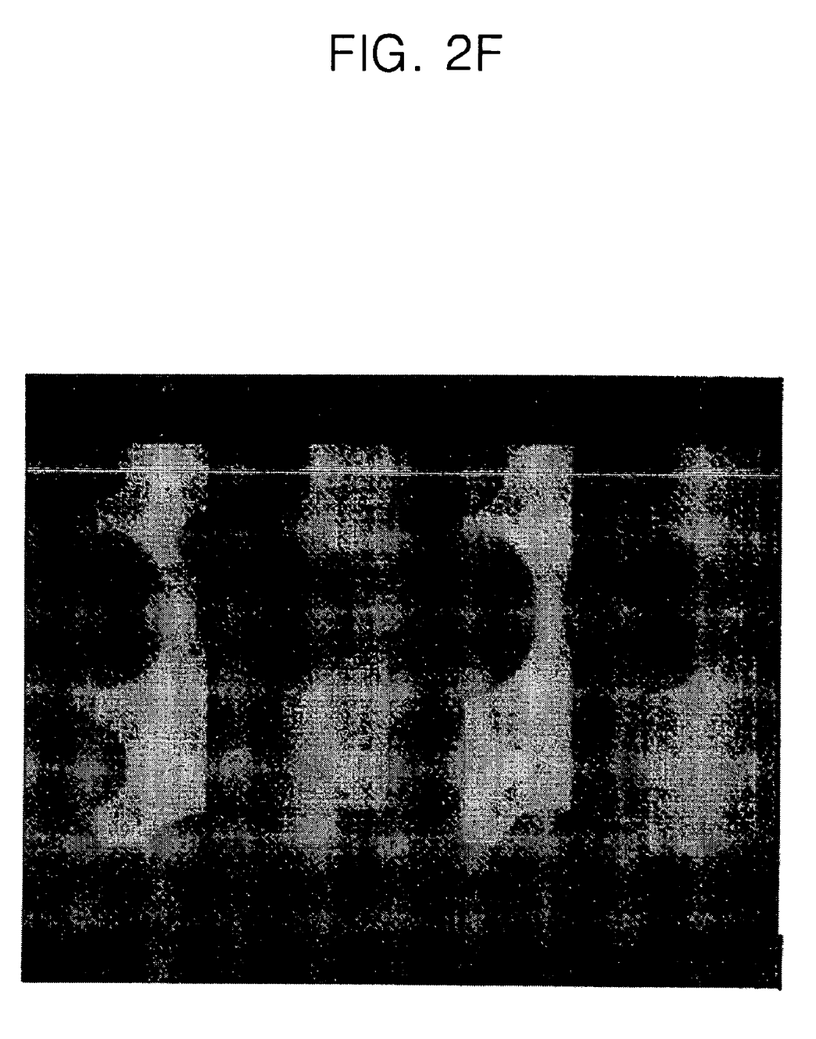
FIG. 2F is an enlarged photograph of the emission region upon generation of the short-induced defect.

Illustratively, FIG. 2F shows an enlarged view of an emission region upon the generation of a short-induced defect.

SUMMARY OF THE INVENTION

The present invention is directed to an improved organic electroluminescent display device that has no pixel definition layer. Embodiments of the present invention also provide a method for fabricating the same, which prevents outgassing and short-induced defects by forming a lower (e.g. pixel) electrode having corners that are rounded off.

In one embodiment, an organic electroluminescent display device includes a thin film transistor formed in a non-emission region on an insulating substrate, which includes source/drain electrodes. The OELD further includes a lower electrode formed in an emission region on the insulating substrate and connected to one electrode of the source/drain electrodes through a contact hole. It also includes an organic emission layer formed in the emission region on the lower electrode, and an upper electrode formed on the organic emission layer, wherein the lower electrode has a surface with its corners rounded off.

In one embodiment, the lower electrode has an upper surface having a center of radius of curvature is at its corners so that the radius of curvature is zero. The lower surface of is the lower electrode has a center of radius of curvature at a point on the same axis as an axis perpendicular to a plane on which the center of radius of curvature of the upper surface is positioned so that the radius of curvature is larger than zero. In this manner, curvature is formed at all four corners of the upper and lower surfaces, respectively. In one embodiment, the upper electrode is a cathode electrode and the lower electrode is an anode electrode.

Another aspect of the present invention provides a method for manufacturing an organic electroluminescent display device. A thin film transistor having source/drain electrodes is formed in a non-emission region on an insulating substrate. A lower electrode is formed in an emission region on the insulating substrate and connected to one electrode of the source/drain electrodes through a contact hole. An organic emission layer is formed in the emission region on the lower electrode. An upper electrode is formed on the organic emission layer, wherein the corners of the lower electrode are rounded off.

The lower electrode has an upper surface whose surface has a rectangular shape in which the center of the radius of curvature is at its corners so that the radius of curvature is zero. The lower electrode also has a lower surface in which the center of the radius of curvature is at a point on the same axis as the center of the radius of curvature of the upper surface so that the radius of curvature of the lower surface is larger than zero, wherein curvature is formed at all four corners of the upper and lower surfaces, respectively.

The lower electrode has an upper surface whose surface is formed rounded and having the center of the radius of curvature at any point thereon, and a lower surface in which the center of the radius of curvature is at a point on the same axis as the center of the radius of curvature of the upper surface so that the radius of curvature of the lower surface is larger than that of the upper surface, wherein curvature is formed at all four corners of the upper and lower surfaces, respectively.

DETAILED DESCRIPTION OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

Figure 3A:
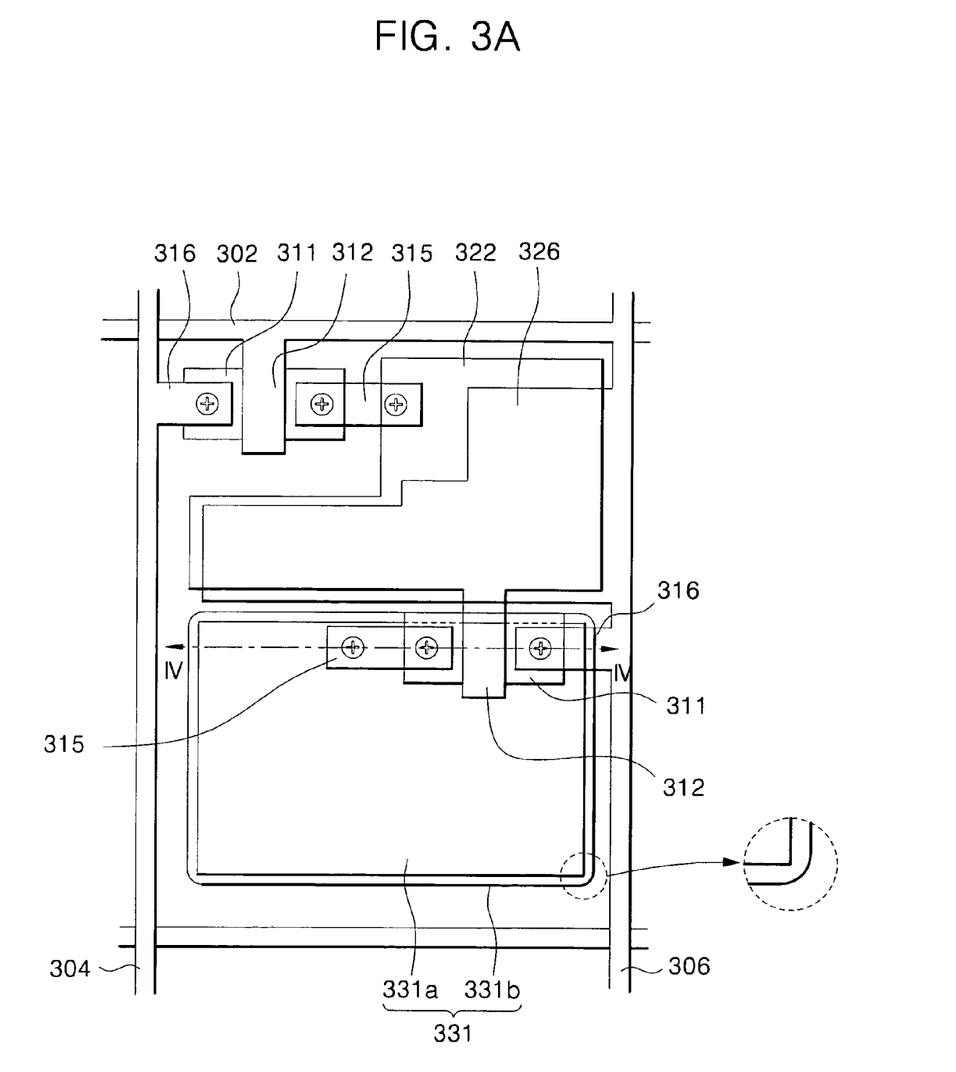
FIG. 3A shows a planar structure of an organic electroluminescent display device according to a first embodiment of the present invention.

FIG. 3A shows a planar structure of an active matrix organic electroluminescent display device (AMOLED) according to a first embodiment of the present invention. The AMOLED of FIG. 3A illustrates a device consisting of two transistors and a capacitor.

Figure 3B:
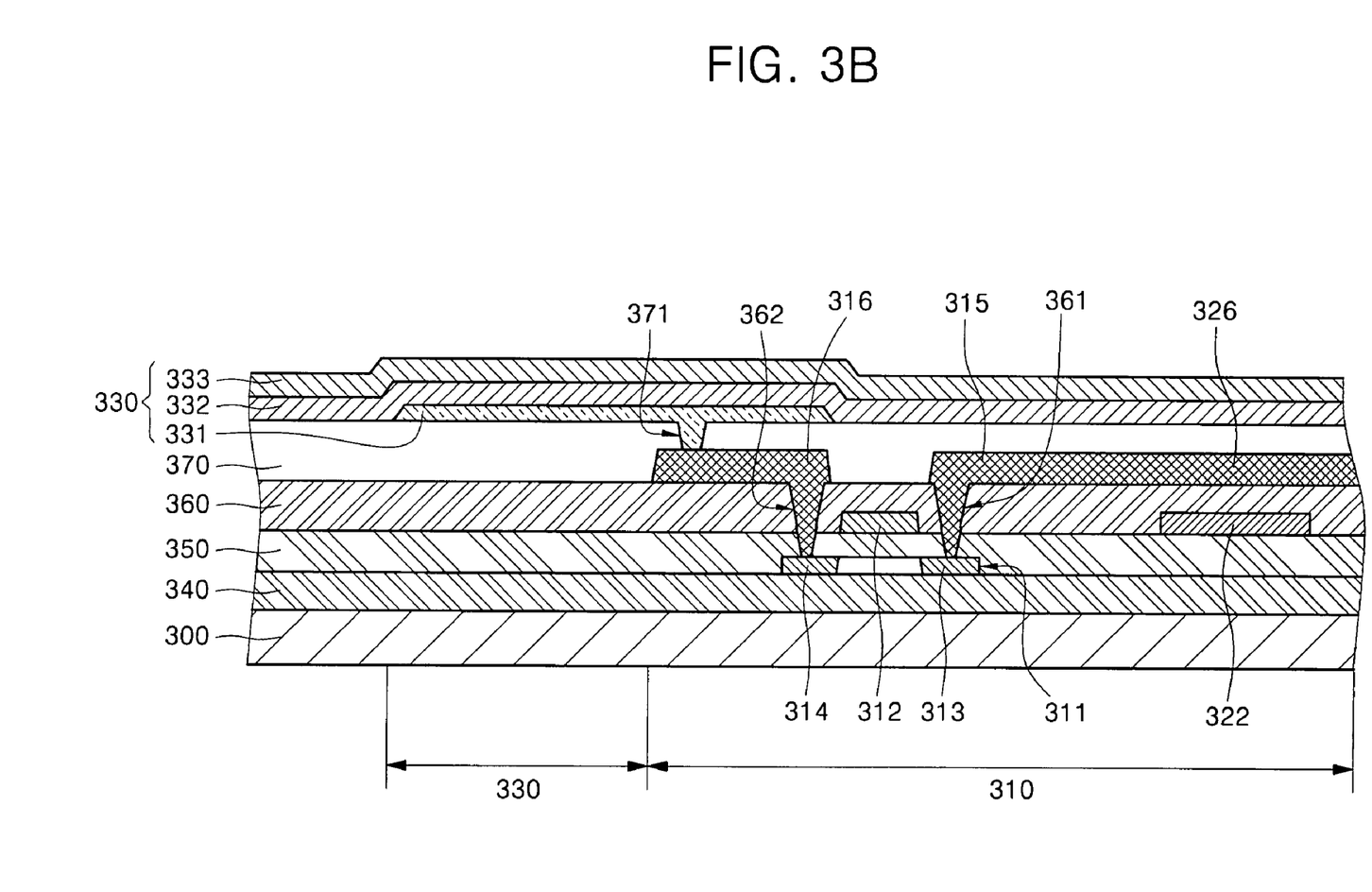
FIG. 3B is a cross-sectional view taken along the line IV-IV of FIG. 3A.

FIG. 3B shows a cross-sectional view taken along the line IV-IV of FIG. 3A.

Referring to FIG. 3B, in an AMOLED formed according to one embodiment of the present invention, a buffer layer 340 is formed on a transparent insulating substrate 300, such as a glass substrate. The substrate includes a non-emission region 310 and an emission region 330. Then, an amorphous silicon layer is deposited on the buffer layer 340 to form a semiconductor layer 311. The semiconductor layer 311 is formed by performing a crystallization process after patterning the amorphous silicon layer. Then, a gate insulating layer 350 is formed on the entire surface of the substrate, and a metallic material for a gate electrode is deposited and patterned on the gate insulating layer 350 to form a gate 312 over the semiconductor layer 311. A capacitor lower electrode 322 is simultaneously formed at this time. Now, upon the formation of the gate 312 and the capacitor lower electrode 322, a gate line 302 of FIG. 3A is also formed.

Thereafter, source/drain regions 313 and 314 are formed by ion implantation of, for example, P or N type impurities, into the semiconductor layer 311.

Next, an interlayer insulating layer 360 is formed on the entire surface of the substrate, and the interlayer insulating layer 360 and the gate insulating layer 350 are etched to expose a portion of the source/drain regions 313 and 314. Thereby, contact holes 361 and 362 for source/drain electrodes are formed.

Then, after a metallic material for the source/drain electrodes is deposited on the interlayer insulating layer 360, the source/drain electrodes 315 and 316 are formed to contact with the source/drain regions 313 and 314 through the contact holes 361 and 362. Here, a capacitor upper electrode 326 is formed which extends from any one electrode, for example, the source electrode 315, of the source/drain electrodes 315 and 316, and at the same time, a data line 304 and a power line 306 of FIG. 3A are also formed.

Thereafter, a passivation layer 370 is formed on the interlayer insulating layer 360. The passivation layer 370 is etched to expose a portion of the other electrode, for example, the drain electrode 316, of the source/drain electrodes 315 and 316, thus forming a contact hole 371 for a pixel electrode.

Then, a transparent conductive layer is deposited on the passivation layer 370 in an emission region 330, and is patterned to form a lower electrode 331 contacting with the drain electrode 316 through the contact hole 371 for the pixel electrode.

Figure 3C:
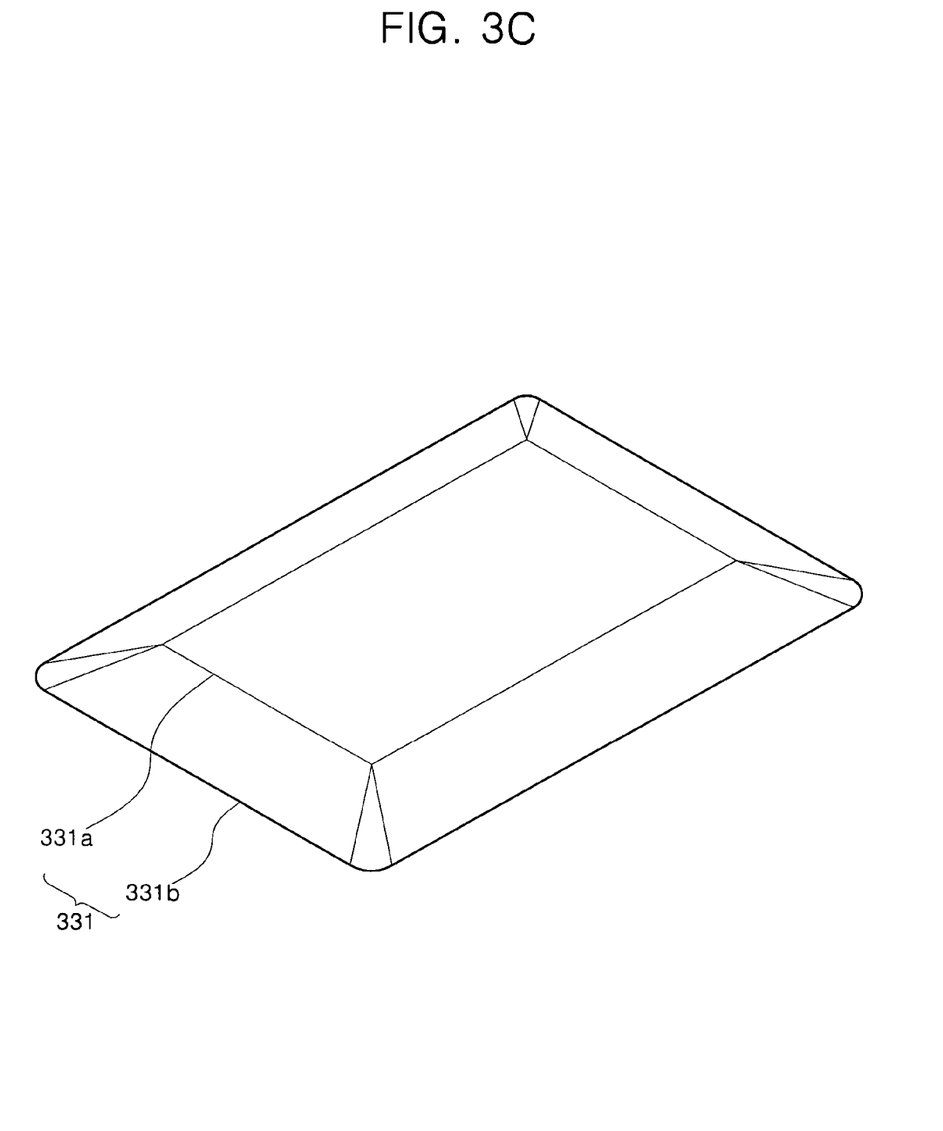
FIG. 3C is a perspective view showing steps for forming the lower electrode of FIG. 3A.
Figure 3D:
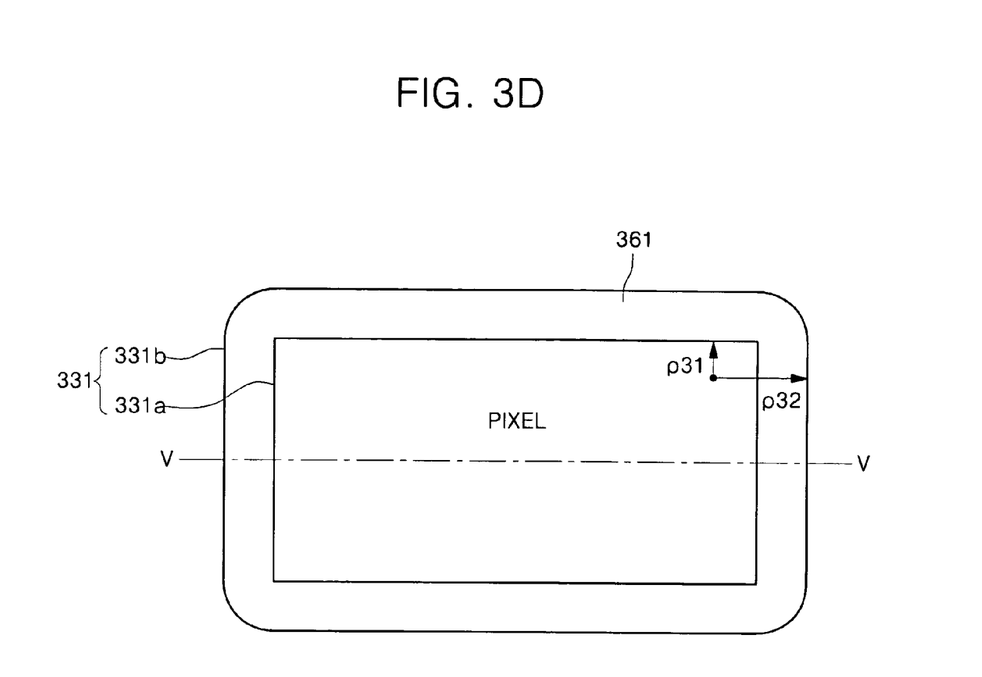
FIG. 3D is a plan view of the lower electrode of FIG. 3C.
Figure 3E:
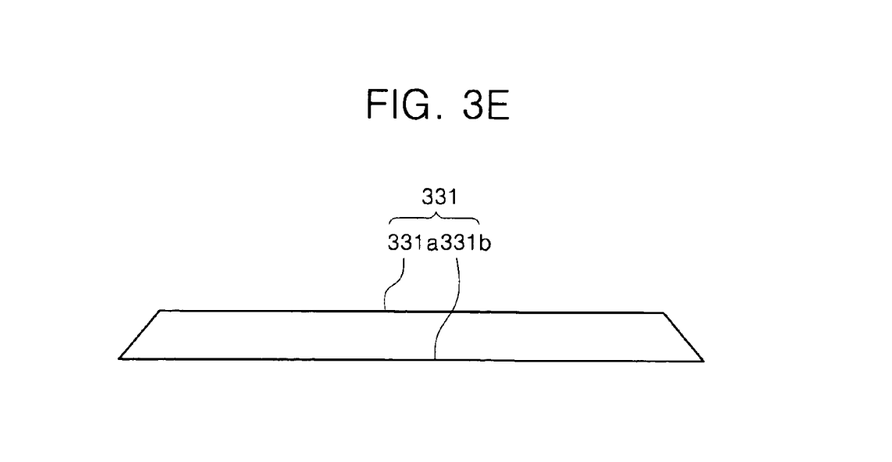
FIG. 3E is a cross-sectional view taken along the line V-V of FIG. 3D.

Now, steps for forming the lower electrode 331 of FIG. 3A are illustrated through FIGS. 3C to 3E.

FIG. 3C is a perspective view showing a whole shape of the lower electrode 331, FIG. 3D is a plan view of the lower electrode 331, and FIG. 3E is a cross-sectional view taken along the line V-V of FIG. 3D.

As shown in FIGS. 3C to 3E, it can be understood that the upper surface 331a of the lower electrode 331 has a rectangular shape, and a lower surface 331b of the lower electrode 331 has rounded corners, so that the lower electrode 331 is tapered.

This can be expressed as following equation.

$$e_{31}=0, e_{3232}>0$$

Here, $e_{31}$ is the radius of curvature of the upper surface 331a, and $e_{32}$ is the radius of curvature of the lower surface 331b. The lower electrode 331 has the upper surface 331a in which the center of the radius of curvature $e_{31}$ is at its corners so that the radius of curvature is zero. Meanwhile, the center of the radius of curvature $e_{32}$ of the lower surface 331b is located at a point on the same axis as an axis perpendicular to a plane on which the center of the radius of curvature of the upper surface 331a is positioned so that the radius of curvature $e_{32}$ is larger than zero. Thus, upper surface 331a has four angled corners and the lower surface 331b has four rounded corners. Accordingly, since the four corners of the lower electrode 331 are not angled, an open edge defect due to cut-off of the organic emission layer 332 can be prevented even after the organic emission layer 332 is deposited.

Next, an organic emission layer 332 is formed on the passivation layer 370 including the lower electrode 331.

Thereafter, an upper electrode 333 made of a metallic material is formed thereon, thereby creating the active matrix organic electroluminescent display device.

In the embodiment just described, the lower electrode acts as an anode electrode and the upper electrode acts as a cathode electrode.

Figure 4A:
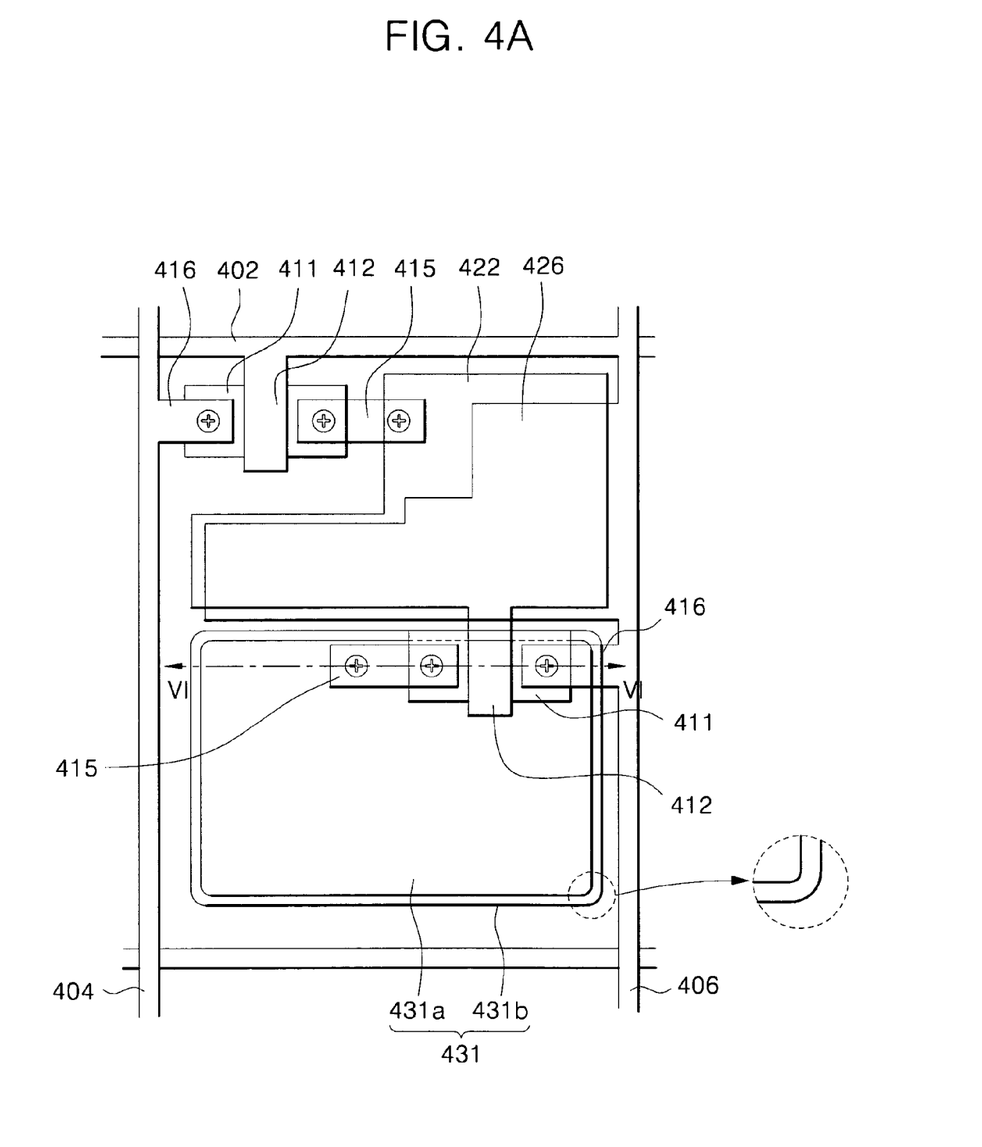
FIG. 4A shows a planar structure of an organic electroluminescent display device according to a second embodiment of the present invention.

FIG. 4A shows a planar structure of an active matrix organic electroluminescent display device (AMOLED) according to a second embodiment of the present invention. The AMOLED of FIG. 4A illustrates a device having two transistors and a capacitor.

Figure 4B:
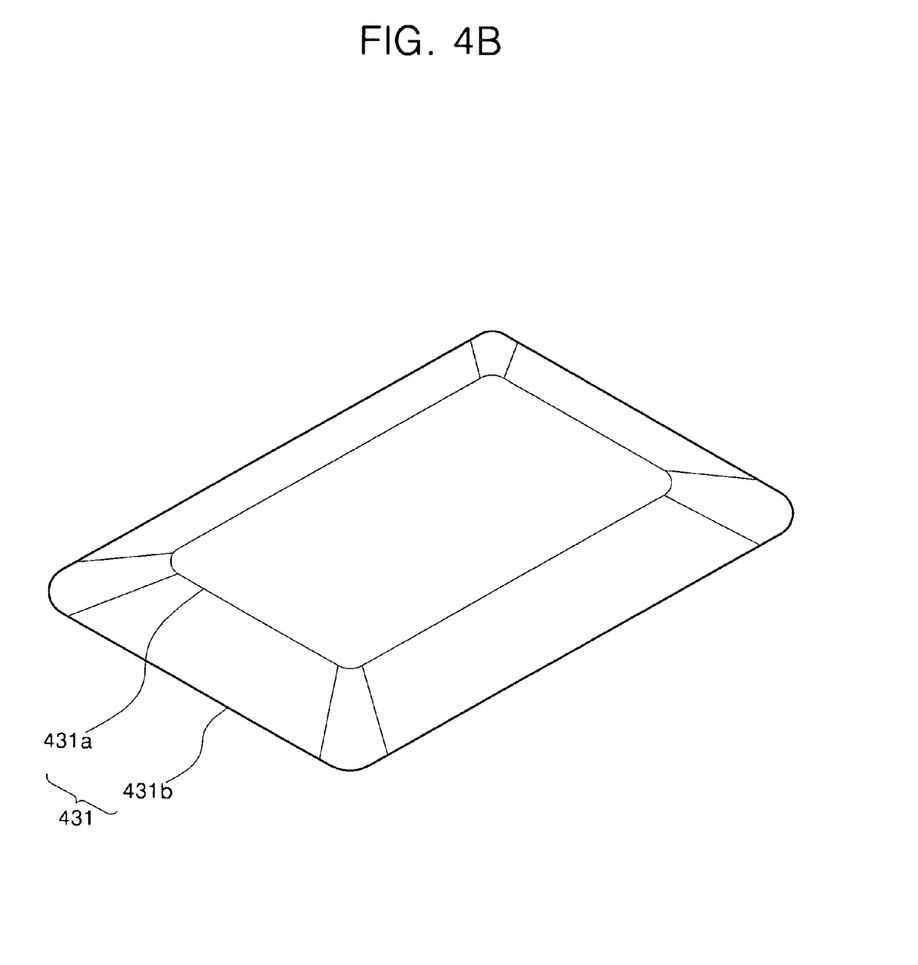
FIG. 4B is a perspective view showing steps for forming the lower electrode of FIG. 4A.

A cross-sectional view taken along the line VI-VI of FIG. 4B illustrates structure similar to that shown in FIG. 3B. Additionally, a method of manufacturing the second embodiment of the present invention will be easily understood by a person skilled in the art with reference to the above description given with regard to the first embodiment. Thus, FIG. 4A need not be described in detail.

However, the steps of an exemplary method for forming the lower electrode 431 of FIG. 4A are explained with reference to FIGS. 4B to 4D.

Figure 4C:
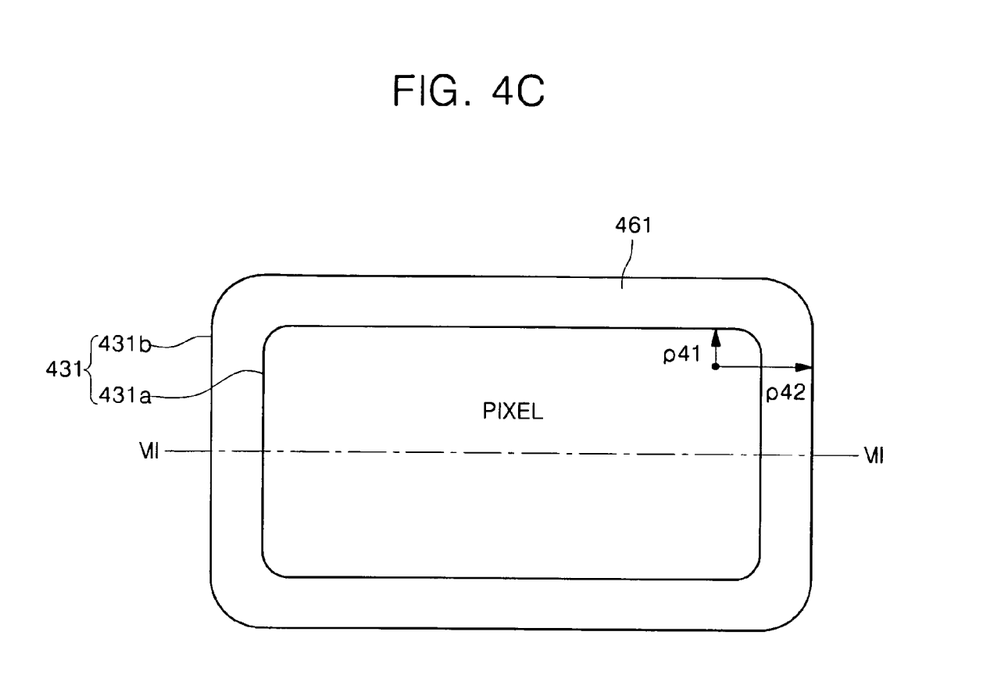
FIG. 4C is a plan view of the lower electrode of FIG. 4A.
Figure 4D:
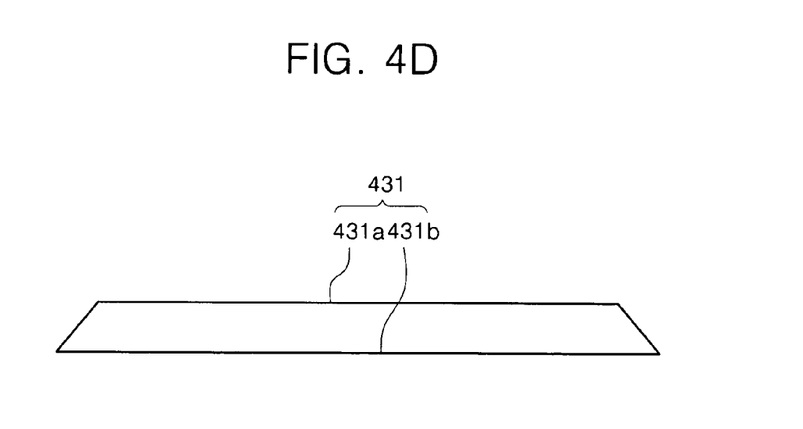
FIG. 4D is a cross-sectional view taken along the line VII-VII of FIG. 4C.

FIG. 4B is a perspective view showing a whole shape of the lower electrode 431, FIG. 4C is a plan view of the lower electrode 431, and FIG. 4D is a cross-sectional view taken along the line VII-VII of FIG. 4C.

Upon the formation of the lower electrode 431, shown in FIG. 4C, four corners of an inner portion of an upper surface 431a are rounded on a plane, four corners of an outer portion of a lower surface 431b are rounded. As shown in FIG. 4D, the lower electrode is formed to be tapered so that the lower surface 431b is formed wider than upper surface 431a.

This can be expressed as following equation.

$$e_{42}>0, e_{41}>0$$

Here, $e_{41}$ is the radius of curvature of the upper surface 431a of the lower electrode 431, and $e_{42}$ is the radius of curvature of the lower surface 431b of the lower electrode 431.

The lower electrode 431 has the upper surface 431a whose four corners each have curvature and the center of the curvature is positioned on the upper surface 431a. The center of the radius of curvature $e_{42}$ of the lower surface 431b is at a point on the same axis as an axis perpendicular to a plane including the center of the radius of curvature $e_{41}$ of the upper surface 431a, wherein the radius of curvature $e_{42}$ of the lower surface 431b is larger than that of the upper surface 431a, and the four corners of the lower surface 431b are also rounded. Thus, four corners of the upper surface 431a and the lower surface 431b as well of the lower electrode are rounded, so that an open edge defect due to cut-off of the organic emission layer (see 332 of FIG. 3B) is further prevented even after the organic emission layer is deposited.

The upper electrode (see 333 of FIG. 3B) is formed on the organic emission layer (332 of FIG. 3B) to supply a common power source.

In this embodiment, the lower electrode 431 is an anode electrode and the upper electrode formed on the organic emission layer is a cathode electrode.

Although several embodiments of the present invention have been described above, curvature of the lower electrode may also be provided at a side portion so that a shape of the surface of the lower electrode forms an oval or circular shape.

According to the embodiment of the present invention as described above, in manufacturing an AMOLED having no pixel definition layer, the lower electrode is formed of a transparent metallic material and has the corners of its upper and lower surfaces rounded off, to prevent outgassing and short-induced defects. Such a configuration improves luminosity and increases the life of the organic electroluminescent display device.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An organic electroluminescent display device, comprising:
    a thin film transistor formed in a non-emission region on an insulating substrate and having source and drain electrodes;
    a lower electrode formed in an emission region on the insulating substrate and connected to one electrode of the source and drain electrodes through a contact hole;
    an organic emission layer formed in the emission region on the lower electrode; and
    an upper electrode formed on the organic emission layer,
    wherein the lower electrode has a surface with its corners rounded off, and
    wherein the lower electrode has an upper surface in which a center of radius of curvature is at its corners so that the radius of curvature is zero, and a lower surface in which the center of radius of curvature is at a point on the same axis as an axis perpendicular to a plane on which the center of radius of curvature of the upper surface is positioned so that the radius of curvature is larger than zero.

2. The organic electroluminescent display device as claimed in claim 1, wherein curvature is formed at all four corners of the upper and lower surfaces, respectively.

3. The organic electroluminescent display device as claimed in claim 1, wherein the upper electrode acts as a cathode electrode and the lower electrode acts as an anode electrode.

4. An organic electroluminescent display device, comprising:
    a thin film transistor formed in a non-emission region on an insulating substrate and having source and drain electrodes;
    a lower electrode formed in an emission region on the insulating substrate and connected to one electrode of the source and drain electrodes through a contact hole;
    an organic emission layer formed in the emission region on the lower electrode; and
    an upper electrode formed on the organic emission layer,
    wherein the lower electrode has a surface with its corners rounded off, and
    wherein the lower electrode has an upper surface whose corners have curvature whose center is positioned on the upper surface, and a lower surface in which the center of the radius of curvature is at a point on the same axis as an axis perpendicular to a plane including the center of the radius of curvature of the upper surface, wherein the radius of curvature of the lower surface is larger than that of the upper surface.

5. The organic electroluminescent display device as claimed in claim 4, wherein curvature is formed at all four corners of the upper and lower surfaces, respectively.

6. The organic electroluminescent display device as claimed in claim 4, wherein the upper electrode acts as a cathode electrode and the lower electrode acts as an anode electrode.

7. A method for manufacturing an organic electroluminescent display device, the method comprising the steps of:
    forming a thin film transistor having source/drain electrodes in a non-emission region on an insulating substrate;
    forming a lower electrode in an emission region on the insulating substrate to be connected to one electrode of the source/drain electrodes through a contact hole;
    forming an organic emission layer in the emission region on the lower electrode; and
    forming a cathode electrode on the organic emission layer,
    wherein the lower electrode has a surface with its corners rounded off, and
    wherein the lower electrode has an upper surface whose surface is formed rectangular in which the center of the radius of curvature is at its corners so that the radius of curvature is zero, and a lower surface in which the center of the radius of curvature is at a point on the same axis as the center of the radius of curvature of the upper surface so that the radius of curvature of the lower surface is larger than zero.

8. The method as claimed in claim 7, wherein curvature is formed at all four corners of the upper and lower surfaces, respectively.

9. A method for manufacturing an organic electroluminescent display device, the method comprising the steps of:
    forming a thin film transistor having source/drain electrodes in a non-emission region on an insulating substrate;
    forming a lower electrode in an emission region on the insulating substrate to be connected to one electrode of the source/drain electrodes through a contact hole;
    forming an organic emission layer in the emission region on the lower electrode; and
    forming a cathode electrode on the organic emission layer,
    wherein the lower electrode has a surface with its corners rounded off, and
    wherein the lower electrode has an upper surface whose surface is formed rounded and having the center of the radius of curvature at any point thereon, and a lower surface in which the center of the radius of curvature is at a point on the same axis as the center of the radius of curvature of the upper surface so that the radius of curvature of the lower surface is larger than that of the upper surface.

10. The method as claimed in claim 9, wherein curvature is formed at all four corners of the upper and lower surfaces, respectively.

* * * * *